(12) United States Patent
Oosumi et al.

(10) Patent No.: US 9,303,333 B2
(45) Date of Patent: Apr. 5, 2016

(54) BISMUTH-SUBSTITUTED RARE-EARTH IRON GARNET CRYSTAL FILM AND OPTICAL ISOLATOR

(75) Inventors: Shuuji Oosumi, Tokyo (JP); Yasutaka Nomi, Tokyo (JP); Nobuo Nakamura, Tokyo (JP); Hiroshi Hatanaka, Tokyo (JP); Tomio Kajigaya, Tokyo (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

(21) Appl. No.: 13/884,363

(22) PCT Filed: Nov. 10, 2011

(86) PCT No.: PCT/JP2011/075919
§ 371 (c)(1),
(2), (4) Date: May 9, 2013

(87) PCT Pub. No.: WO2012/073670
PCT Pub. Date: Jun. 7, 2012

(65) Prior Publication Data
US 2013/0224520 A1 Aug. 29, 2013

(30) Foreign Application Priority Data
Nov. 29, 2010 (JP) .................................. 2010-265607

(51) Int. Cl.
C30B 29/34 (2006.01)
G02B 1/02 (2006.01)
C30B 19/12 (2006.01)
C30B 29/28 (2006.01)
G02F 1/09 (2006.01)
G02F 1/00 (2006.01)

(52) U.S. Cl.
CPC ................. *C30B 29/34* (2013.01); *C30B 19/12* (2013.01); *C30B 29/28* (2013.01); *G02B 1/02* (2013.01); *G02F 1/0036* (2013.01); *G02F 1/093* (2013.01)

(58) Field of Classification Search
None
See application file for complete search history.

(56) References Cited

FOREIGN PATENT DOCUMENTS

| JP | 6-281902 A | 10/1994 |
|----|------------|---------|
| JP | H6-281902 | 10/1994 |
| JP | H7-281129 | 10/1995 |
| JP | H8-169799 | 7/1996 |
| JP | H8-290997 | 11/1996 |
| JP | H8-290998 | 11/1996 |
| JP | H9-59093 | 3/1997 |
| JP | 2000-66160 | 3/2000 |
| JP | 2007-256616 A1 | 10/2007 |

OTHER PUBLICATIONS

JP08-169799 MT, Jul. 1996.*
JP06-281902 MT, Oct. 1994.*
International Search Report for International Application No. PCT/JP2011/075919 dated Dec. 20, 2011.
Extended European Search Report dated Jun. 17, 2014 issued in counterpart application No. 11845707.6.
Walter R. Eppler et al.: "Garnets for Short Wavelength Magneto-Optic Recording", Journal of Phys. Chem. Solids, vol. 56, No. 11, Apr. 7, 1995, pp. 1479-1490.
G. P. Espinosa: "Crystal Chemical Study of the Rare-Earth Iron Garnets", Journal of Chemical Physics, American Institute of Physics, vol. 37, No. 10, Jan. 1, 1962, pp. 2344-2347.
C. D. Brandle et al.: "Crystal Stoichiometry and Growth of Rare-Earth Garnets Containing Scandium", Journal of Crystal Growth, vol. 20, No. 1, Jun. 25, 1973, pp. 1-5.
Taketoshi Hibiya et al.: "Refractive index of Bi-substituted gadolinium iron garnet films grown by liquid-phase epitaxy", Journal of Applied Physics, vol. 58, Feb. 12, 1985, pp. 510-512.
Andrew H. Eschenfelder: "Bubble Materials", Springer Series in Solid State Sciences, Springer Verlag, Berlin, DE, vol. 14, Jan. 1, 1981, pp. 163-224.
V. J. Fratello et al.: "Effect of bismuth doping on thermal expansion and misfit dislocations in epitaxial iron garnets", Journal of Crystal Growth, vol. 142, No. 1-2, Sep. 15, 1994, pp. 93-102.
R. Krishnan: "Empirical estimation of Faraday rotation in some rare-earth iron garnets", Applied Physics Letters, vol. 31, May 26, 1977, pp. 237-239.

* cited by examiner

*Primary Examiner* — Vera Katz
(74) *Attorney, Agent, or Firm* — Kratz, Quintos & Hanson, LLP

(57) ABSTRACT

A bismuth-substituted rare-earth iron garnet crystal film (RIG) which has an insertion loss of less than 0.6 dB and which can be produced in a high yield, as well as an optical isolator, which is grown by liquid phase epitaxy on a non-magnetic garnet substrate represented by a chemical formula of $Gd_3(ScGa)_5O_{12}$, wherein the RIG is represented by a chemical formula of $Nd_{3-x-y}Gd_xBi_yFe_5O_{12}$, and x and y satisfy $0.89 \leq x \leq 1.43$ and $0.85 \leq y \leq 1.19$. In contrast to conventional RIGs, the RIG represented by the chemical formula of $Nd_{3-x-y}Gd_xBi_yFe_5O_{12}$ of the present invention has an insertion loss of less than 0.6 dB and makes it possible to reduce the amount of heat generated because of absorption of light at wavelengths of about 1 μm. Hence, the RIG has such a remarkable effect that the RIG can be used as a Faraday rotator used for an optical isolator in a high-power laser device for processing.

2 Claims, 1 Drawing Sheet

BISMUTH-SUBSTITUTED RARE-EARTH IRON GARNET CRYSTAL FILM AND OPTICAL ISOLATOR

TECHNICAL FIELD

The present invention relates to an optical isolator used as a countermeasure against optical feedback in a high-power laser device for processing. In particular, the present invention relates to improvements in an optical isolator and in a bismuth-substituted rare-earth iron garnet used as a Faraday rotator.

BACKGROUND ART

In lasers such as semiconductor lasers used for optical communications and solid lasers used for laser processing etc., the laser oscillation is destabilized if light reflected by an optical surface or a work surface located outside a laser resonator returns to a laser element. The destabilized oscillation results in noise in a signal in the case of optical communications, or may result in destruction of the laser element in the case of a laser for processing. For this reason, an optical isolator is used for blocking such reflected optical feedback to prevent the reflected optical feedback from returning to the laser element.

In the meantime, fiber lasers have recently attracted attention as an alternative to the YAG laser (a laser for processing). Conventionally, a terbium gallium garnet crystal (hereinafter, referred to as a TGG) or a terbium aluminum garnet crystal (hereinafter, referred to as a TAG) has been used as a Faraday rotator used in an optical isolator in the fiber lasers.

However, the TGG and the TAG each have a small Faraday rotation coefficient per unit length. Hence, in order to obtain a polarization rotation angle of 45 degrees so as to function as an optical isolator, the TGG or the TAG needs to have a long optical path length, and hence a large crystal has been used. Moreover, in order to obtain a high optical isolation, it is necessary to apply a uniform and large magnetic field to the crystal. Hence, a strong and large magnet has been used. For this reason, the optical isolator is large in size. Moreover, because of the long optical path length, the shape of beams of the laser may be distorted in the crystal, which necessitates an optical system for correcting the distortion, in some cases. Moreover, since the TGG is expensive, there is a demand for a small and inexpensive Faraday rotator.

On the other hand, great reduction in size can be achieved by using, in an optical isolator of this type, a bismuth-substituted rare-earth iron garnet crystal film (hereinafter, referred to as an RIG), which is used exclusively in the field of optical communications. However, an RIG is known to deteriorate in performances when the wavelength of light used is shortened to around 1.1 μm, which is employed for a laser for processing, because a large amount of light is absorbed by iron ions, and this light absorption causes rise in temperature.

In this respect, methods have been proposed to solve the problem of rise in temperature in an RIG. For example, Patent Documents 1 and 2 describe a method in which a gadolinium gallium garnet substrate (hereinafter, referred to as a GGG substrate), which is an RIG growth substrate to be removed by grinding in ordinary cases, is left unremoved to facilitate dissipation of heat generated in an RIG. Moreover, a method (Patent Document 3) has been also proposed which uses a substrate, such as sapphire, having a high thermal conductivity and being conventionally used as a heat dissipation substrate.

However, any of these approaches is a mere technology for dissipation of heat generated in an RIG, and any of these approaches does not reduce the light absorption. Hence, there is a demand for a technology for reducing the amount of heat generated in an RIG by reducing the light absorbed by the RIG itself.

Here, it has been known that the above described iron ions contained in an RIG absorb light of about 1 μm, which is a wavelength of a laser for processing. However, iron is an important element which produces the Faraday effect in an RIG. Reduction in iron component results in increase in film thickness of the RIG necessary for achieving a Faraday rotation angle of 45°, which an optical isolator is required to have. Hence, in such a case, the reduction in amount of light absorbed in an RIG cannot be achieved, after all.

In this respect, as a technology for reducing the light absorption in an RIG at wavelengths around the 1 μm region, a method has been proposed in which the light absorbed by the iron ions is shifted toward shorter wavelengths by using, as an RIG growth substrate, a non-magnetic garnet substrate having a larger lattice constant instead of a $(CaGd)_3(ZrMgGa)_5O_{12}$ substrate (hereinafter, referred to as an SGGG) having a lattice constant of 1.2497 nm and being widely used from the past in general. For example, Patent Document 4 describes an example in which an RIG was grown by using a $Gd_3(ScGa)_5O_{12}$ substrate (hereinafter, referred to as a GSGG) having a lattice constant of 1.256 nm. Meanwhile, each of Patent Documents 5 and 6 describes an example in which an RIG was grown by using a $Sm_3(ScGa)_5O_{12}$ substrate (hereinafter, referred to as an SSGG) or a $La_3(ScGa)_5O_{12}$ substrate (hereinafter, referred to as an LSGG) having a lattice constant in the range from 1.264 to 1.279 nm.

In addition, any of these technologies is a method in which an RIG is grown by using a non-magnetic garnet substrate having a larger lattice constant than that of the conventionally used SGGG. By these methods, light absorbed by iron ions contained in an RIG is shifted toward shorter wavelengths, so that the amount of light absorbed is reduced.

However, when the thickness of the RIG of Patent Document 4 grown by employing a $Gd_3(ScGa)_5O_{12}$ substrate (GSGG) having a lattice constant of 1.256 nm is adjusted to achieve a Faraday rotation angle of 45°, the absorption loss at a wavelength of 1.05 μm is about 1 dB, and the RIG does not have a sufficiently low loss. On the other hand, the RIGs of Patent Documents 5 and 6 grown by employing an SSGG or an LSGG having a lattice constant in the range from 1.264 to 1.279 nm do have absorption losses of 0.6 dB or less at a wavelength of 1.064 μm. However, since the SSGG and the LSGG are, in reality, difficult to obtain stably in the market, neither the SSGG nor the LSGG can be used as a substrate industrially.

CONVENTIONAL ART DOCUMENTS

Patent Documents

Patent Document 1: Japanese Patent Application Publication No. 2000-66160
Patent Document 2: Japanese Patent Application Publication No. Hei 7-281129
Patent Document 3: Japanese Patent Application Publication No. 2007-256616
Patent Document 4: Japanese Patent Application Publication No. Hei 6-281902

Patent Document 5: Japanese Patent Application Publication No. Hei 8-290997

Patent Document 6: Japanese Patent Application Publication No. Hei 8-290998

DISCLOSURE OF THE INVENTION

Problems to be Solved by the Invention

As described above, it is difficult to industrially obtain an RIG having a low loss of less than 0.6 dB for light at wavelengths in the 1 μm region by any of the conventional approaches.

However, there is a demand for a low loss RIG having an insertion loss of less than 0.6 dB in the market of optical isolators used for small and inexpensive 1-W class lasers for processing in which RIGs are used. In particular, it has been recently planned that RIGs are employed in optical isolators of laser devices for processing of 1-W class or larger. For this reason, there is a need for an extremely low loss RIG having an insertion loss of 0.5 dB or less in the market, and there is a demand for an approach which makes it possible to provide a low loss RIG industrially in a high yield.

Means for Solving the Problems

In this connection, when a large amount of Bi is added to the bismuth-substituted rare-earth iron garnet crystal film (RIG), the Faraday rotation coefficient of the RIG increases (see Paragraph 0003 of Patent Document 4), and hence the thickness of the RIG can be reduced. Moreover, when a large amount of Bi, which has a large ion radius, is added, the lattice constant of the RIG increases, and hence the light absorbed by the iron ions can be shifted toward shorter wavelengths. Hence, it has conventionally been a general practice to increase the amount of Bi added to the RIG under a concept that a crystal with a low insertion loss can be easily obtained in such a case.

However, it has been known that if the amount of Bi added is too large, the mismatch in lattice constant between the RIG and the GSGG substrate having a lattice constant of 1.256 nm increases, so that the RIG grown on the GSGG substrate tends to crack. Thus, the RIG cannot be produced in a high yield.

In this respect, the present inventors have conducted earnest study to solve the above-described problems. As a result, the present inventors have found that even when the amount of Bi added is small, a bismuth-substituted rare-earth iron garnet crystal film (RIG) with a low insertion loss can be obtained by selecting the kinds of the rare-earths and by controlling the amounts of the rare-earths added in the RIG. Moreover, it has been found that since the lattice constant of the RIG and the lattice constant of the GSGG substrate can be matched because of the reduction in amount of Bi added, the cracking of the RIG is reduced, and the RIG can be produced in a high yield, even when the RIG is grown on the GSGG substrate.

The present invention has been completed based on such technical findings.

Specifically, a bismuth-substituted rare-earth iron garnet crystal film according to the present invention is a bismuth-substituted rare-earth iron garnet crystal film which is grown by liquid phase epitaxy on a non-magnetic garnet substrate represented by a chemical formula of $Gd_3(ScGa)_5O_{12}$, wherein the bismuth-substituted rare-earth iron garnet crystal film is represented by a chemical formula of $Nd_{3-x-y}Gd_xBi_yFe_5O_{12}$, and x and y in the chemical formula satisfy $0.89 \leq x \leq 1.43$ and $0.85 \leq y \leq 1.19$.

Meanwhile, an optical isolator according to the present invention comprises the above-described bismuth-substituted rare-earth iron garnet crystal film of the present invention used as a Faraday rotator.

Effects of the Invention

The bismuth-substituted rare-earth iron garnet crystal film (RIG) according to the present invention is represented by a chemical formula of $Nd_{3-x-y}Gd_xBi_yFe_5O_{12}$, and x and y in the chemical formula satisfy $0.89 \leq x \leq 1.43$ and $0.85 \leq y \leq 1.19$. In contrast to the conventional RIGs described in Patent Document 4 and the like, the RIG according to the present invention has an insertion loss of less than 0.6 dB, and can be produced in a high yield.

In addition, by employing the RIG of the present invention having an insertion loss of less than 0.6 dB, the amount of heat generated in the RIG itself can be reduced. For this reason, by employing the RIG of the present invention for an optical isolator in a laser for processing, the rise in temperature can be greatly reduced even in the case of laser light with further high power. Hence, an effect of reducing deterioration in characteristics is achieved in such a case.

MODES FOR PRACTICING THE INVENTION

Figure 1:
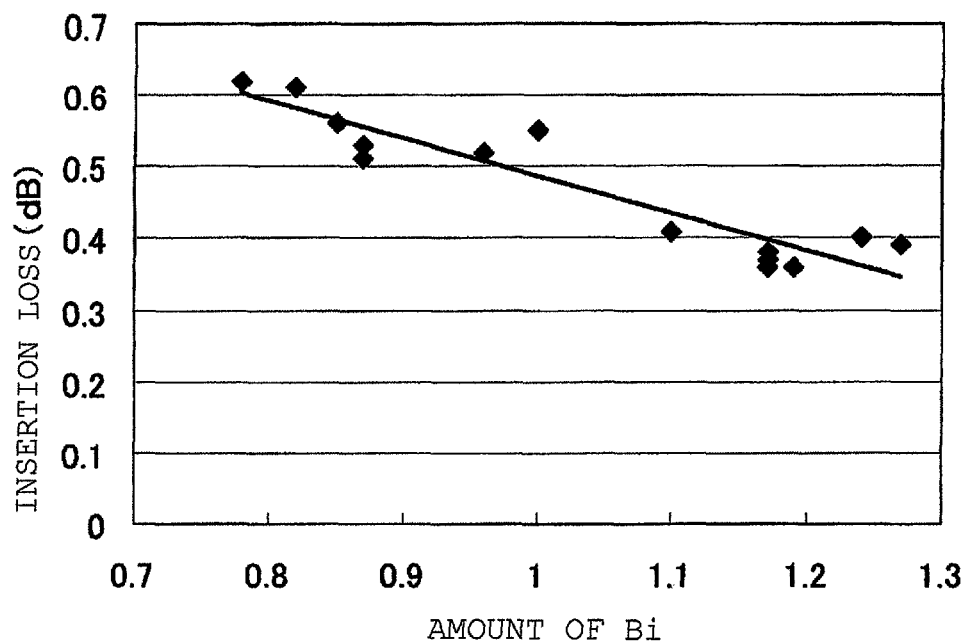
FIG. 1 is a graph showing the relationship between the amount of Bi and insertion loss.

Hereinafter, embodiments of the present invention will be described in detail.

(A) Selection of Rare-Earth

The kinds of rare-earth elements constituting a bismuth-substituted rare-earth iron garnet crystal film (RIG) according to the present invention need to be Nd and Gd.

When a crystal is grown on a substrate by liquid phase epitaxy, the lattice constants of the substrate and the crystal film need to be matched. For a GSGG substrate, which has a lattice constant of 1.256 nm, many rare-earth elements can be selected because of the large lattice constant of the GSGG substrate. Among the rare-earth elements, lanthanides with atomic numbers from 57 to 71 have ion radius which decrease in the following order because of a phenomenon called the lanthanide contraction: La>Ce>Pr>Nd>Pm>Sm>Eu>Gd>Tb>Dy>Ho>Er>Tm>Yb>Lu.

Now, if Bi, which has a large ion radius, is not introduced into an RIG, the Faraday rotation performance of the RIG degrades, and the thickness of the RIG required to achieve a Faraday rotation angle of 45° increases, so that the insertion loss due to light absorption increases. Hence, it is not preferable to select only rare-earth elements having large ion radii, because this makes it difficult to introduce Bi into the RIG.

The chemical formula of a bismuth-substituted rare-earth iron garnet crystal film (RIG) is represented by $R_{3-x-y}Gd_xBi_yFe_5O_{12}$, where x represents the amount of Gd and y represents the amount of Bi. Note that R in the chemical formula is a rare-earth element other than Gd. Here, when the amount of Bi increases, the coefficient of thermal expansion of the RIG increases with the increase in amount of Bi, and the difference in lattice constant between the RIG and the substrate increases. Hence, there arise problems of reduction in productivity and deterioration in performances associated with cracking of the RIG during the growth, dislocation in the RIG, or the like. In addition, it has been known that when the amount of Bi exceeds 1.3, it is difficult to grow a good quality RIG. It is not preferable to use a rare-earth element having a small ion radius (for example, Tm, Yb, Lu, or the like), which allows an RIG having an amount of Bi exceeding 1.3 to be obtained.

Moreover, in addition to the above-described rare-earth elements, Sm is not preferable because Sm has many absorption peaks near the 1 μm region. Since Eu may be divalent, Eu, which takes a divalent state, is not preferable for an RIG, because it has been known that the absorption in an RIG increases when a divalent element is added.

For these reasons, Gd from rare-earth elements having moderate ion radii and Nd from rare-earth elements having large ion radii are selected as the rare-earth elements constituting the bismuth-substituted rare-earth iron garnet crystal film according to the present invention. It has been shown that, in such a case, both a favorable insertion loss and a high yield can be achieved by employing the ratio between Nd and Gd and the amount of Bi, which will be described later.

(B) Ratio Between Nd and Gd

Regarding the ratio between Nd and Gd, too large an amount of Nd results in a large lattice constant of the RIG, and too large a lattice constant of the RIG results in an increased possibility of cracking because the RIG warps convexly, when the RIG is cooled to room temperature after the growth of the RIG. On the other hand, too small an amount of Nd results in a small lattice constant of the RIG, resulting in an increased possibility of cracking because the RIG warps concavely.

Here, the amount of Gd needs to be in the range from 0.89 to 1.43 based on the column "Amount of Gd" in Table 2, which shows the results of Examples and Comparative Examples below. Meanwhile, the amount of Bi needs to be in the range from 0.85 to 1.19 based on Table 1 described in the section C "Relationships between Amount of Bi and Insertion Loss and between Amount of Bi and Yield" below and also on the results shown in FIG. 1.

In addition, regarding the amount of Nd, a lower limit value of the amount of Nd is as follows: (3−1.43−1.19=0.38), whereas an upper limit value thereof is as follows: (3−0.89−0.85=1.26), on the basis of the formula of (3-x-y) shown in the chemical formula of $Nd_{3-x-y}Gd_xBi_yFe_5O_{12}$, the amount of Gd (the value of x), and the amount of Bi (the value of y). Specifically, the amount of Nd is in the range from 0.38 to 1.26.

(C) Relationships Between Amount of Bi and Insertion Loss and Between Amount of Bi and Yield Absorption of light at around 1 μm by iron ions causes the rise in temperature in a Faraday rotator in which a bismuth-substituted rare-earth iron garnet crystal film (RIG) is employed. The absorption coefficient increases with the rise in temperature, and hence further rise in temperature is brought about. For this reason, when an RIG has a large insertion loss, the use of the RIG is limited to low-power lasers for reducing the heat generation, and a substrate for heat dissipation needs to be attached. When an RIG is employed for a 1-W class laser for processing, the insertion loss needs to be 0.6 dB or less. The insertion loss needs to be 0.5 dB or less for a further-high-power laser.

Here, it has been shown from the graph of FIG. 1 that, when the amount of Bi in an RIG represented by a chemical formula of $Nd_{3-x-y}Gd_xBi_yFe_5O_{12}$ is less than 0.85, the thickness of the RIG required to achieve a Faraday rotation angle of 45° increases, so that the insertion loss due to light absorption increases, and a low loss RIG having a loss of less than 0.6 dB cannot be obtained.

The graph of FIG. 1 shows the relationship between the amount of Bi and insertion loss.

The graph of FIG. 1 was obtained as follows. Specifically, the amount of Bi in each of RIGs grown by liquid phase epitaxy was determined by SPMA quantitative analysis. Subsequently, each of the grown RIGs was cut into 11-mm square pieces with a dicing saw, and further the thickness of the RIG was adjusted by grinding to achieve a Faraday rotation angle of 45° for light at a wavelength of 1.06 μm. Anti-reflection films for light at a wavelength of 1.06 μm were formed on both sides. Then, the insertion loss was measured by entering $YVO_4$ laser light at a wavelength of 1.06 μm. The graph of FIG. 1 was obtained from such results. In addition, on the basis of the graph of FIG. 1, the amount of Bi needs to be 0.85 or more in order for the RIG to have an insertion loss of 0.6 dB or less. Furthermore, the amount of Bi is desirably 0.97 or more in order for an RIG to have an insertion loss of 0.5 dB or less.

Next, Table 1 below shows the relationship between the amount of Bi and the yield.

Table 1 was obtained as follows. Specifically, the amount of Bi in each of RIGs grown by liquid phase epitaxy and represented by the chemical formula of $Nd_{3-x-y}Gd_xBi_yFe_5O_{12}$ was determined by EPMA quantitative analysis. Subsequently, each of the grown RIGs was cut into 11-mm square pieces with a dicing saw, and the 11-mm square pieces were further cut into 1-mm square pieces. Of these 1-mm square pieces, pieces having corner chipping deformation due to cracks occurring in the RIG were regarded as defective, whereas pieces without corner chipping were selected as non-defective pieces. Subsequently, the number of pits present on the 1-mm square surface of each of all the non-defective pieces was observed with a metallographic microscope and an infrared microscope. If the number of pits in the 1-mm square surface area exceeded 5, the piece was regarded as defective, whereas a piece having 5 or less pits was regarded as a non-defective piece. Thus, the yield of each of the RIGs with different amounts of Bi was determined.

Note that, based on an empirical rule, when the ratio of the non-defective pieces was 90% or higher, the yield was determined as a high yield. In addition, when all the 1-mm square pieces were non-defective pieces, the number of the 1-mm square pieces was 100.

TABLE 1

| Amount of Bi | Number of defective 1-mm square pieces due to cracks | Number of defective 1-mm square pieces due to pits | Defective rate (%) | Yield of non-defective pieces (%) |
|---|---|---|---|---|
| 0.85 | 0 | 0 | 0 | 100 |
| 0.96 | 0 | 0 | 0 | 100 |
| 1.10 | 0 | 0 | 0 | 100 |
| 1.17 | 0 | 2 | 2 | 98 |
| 1.19 | 0 | 10 | 10 | 90 |
| 1.24 | 12 | 14 | 26 | 74 |
| 1.27 | 17 | 41 | 58 | 42 |

"Evaluation"

From Table 1, it can be understood that the yield of RIGs decreases with increase in amount of Bi. Here, the amount of Bi is preferably 1.19 or less, because the RIGs can be grown in a yield of 90% or higher.

In addition, from the results obtained in "Relationship between Amount of Bi and Insertion Loss" and "Relationship between Amount of Bi and Yield," it has been found that the amount of Bi (the value of y) in the RIG represented by the chemical formula of $Nd_{3-x-y}Gd_xBi_yFe_5O_{12}$ needs to be in the range of $0.85 \leq y \leq 1.19$, and that an RIG having an insertion loss of less than 0.6 dB can be grown in a high yield by using a GSGG substrate having a lattice constant of 1.256 nm.

Figure 2:
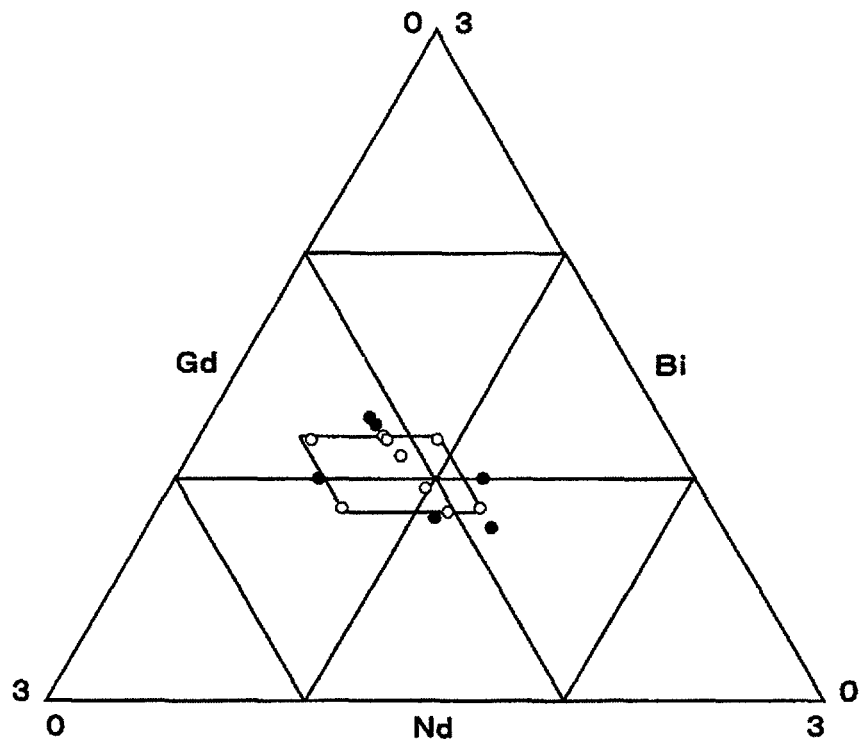
FIG. 2 is a Nd—Gd—Bi ternary composition diagram showing the composition between Nd, Gd, and Bi.

From the above described results, the composition between Nd, Gd, and Bi of the RIG represented by the chemical formula of $Nd_{3-x-y}Gd_xBi_yFe_5O_{12}$ is desirably in the range shown in the Nd—Gd—Bi ternary composition diagram in FIG. 2. Note that, in FIG. 2, white circles represent Examples below, whereas black circles represent Comparative Examples.

EXAMPLES

Hereinafter, Examples of the present invention will be described specifically while showing Comparative Examples.

Note that all non-magnetic garnet substrates used in Examples 1 to 9 and Comparative Examples 1 to 6 were $Gd_3(ScGa)_5O_{12}$ substrates, i.e., GSGG substrates, having a diameter of 1 inch and a lattice constant of 1.2564 nm.

In addition, each of the RIGs in Examples 1 to 9 had a composition satisfying the above-described conditions shown in (A) "Selection of Rare-Earth," (B) "Ratio between Nd and Gd," and (C) "Relationships between Amount of Bi and Insertion Loss and between Amount of Bi and Yield," at the stage of designing the composition.

Meanwhile, each of the RIGs in Comparative Examples 1 to 6 had a composition not satisfying any one or more conditions of the above-described conditions (A), (B), and (C).

Note that the amount of Bi and the amount of Gd were values determined by EPMA quantitative analysis, and the defective rate and the ratio of the non-defective pieces were obtained as follows. Specifically, 11-mm square pieces were cut out from each RIG, and further one hundred 1-mm square pieces were cut out from the 11-mm square pieces. Subsequently, the 1-mm square pieces were sorted into defective pieces and non-defective pieces on the basis of the shape thereof and the number of pits in the surface. Note that the defective pieces were those having corner chipping deformation due to cracks occurring in the RIG or those having no corner chipping but having more than 5 pits in the 1-mm square surface observed with a metallographic microscope and an infrared microscope. Likewise, those having no corner chipping and having 5 or less pits in the surface were selected as the non-defective pieces. The defective rate and the ratio of the non-defective pieces were the incidences of the defective pieces and the non-defective pieces based on the results, respectively. Moreover, in Table 2, comparisons are made regarding the defective rates, the ratios of the non-defective pieces, and the insertion losses of the RIGs according to Examples and Comparative Examples.

Example 1

First, 1.18 g of $Nd_2O_3$, 2.80 g of $Gd_2O_3$, 29.59 g of $Fe_2O_3$, 255.12 g of $Bi_2O_3$, 201.64 g of PbO, and 9.68 g of $B_2O_3$ were weighed as raw materials, melted at 1000° C. in a platinum crucible, and sufficiently mixed with stirring, so that the melt had a uniform composition.

Next, in order to epitaxially grow an RIG, the temperature of the melt was lowered to a growth temperature of 768° C. After that, the above-described GSGG substrate was set with only one surface thereof being immersed in the melt. While the GSGG substrate was being rotated, an RIG was epitaxially grown. The EPMA quantitative analysis of the obtained RIG showed that the amount of Bi was 1.19, and the amount of Gd was 1.10.

From the RIG grown under such conditions, 11-mm square pieces, and further 1-mm square pieces were cut out, and observed. A favorable result was obtained in which the number of defective pieces was 10 and the number of non-defective pieces was 90. In addition, the thickness of the RIG was adjusted by grinding to achieve a Faraday rotation angle of 45° for light at a wavelength of 1.06 µm. Subsequently, anti-reflection films for light at a wavelength of 1.06 µm were formed on both sides. Then, the insertion loss (IL) was measured by entering $YVO_4$ laser light at a wavelength of 1.06 µm. An extremely favorable result of 0.36 dB was obtained. Table 2 collectively shows these results.

Example 2

An RIG was grown in the same manner as in Example 1, except that the raw material composition was changed by weighing 1.25 g of $Nd_2O_3$, 2.84 g of $Gd_2O_3$, 29.53 g of $Fe_2O_3$, 255.09 g of $Bi_2O_3$, 201.61 g of PbO, and 9.67 g of $B_2O_3$ as raw materials, and that the growth temperature was 770° C. In the obtained RIG, the amount of Bi was 1.17, and the amount of Gd was 1.10.

Then, the RIG was observed in the same manner as in Example 1. An extremely favorable result was obtained in which the number of defective pieces was 2 and the number of non-defective pieces was 98. In addition, the thickness of the RIG was adjusted by grinding to achieve a Faraday rotation angle of 45° for light at a wavelength of 1.06 µm. Subsequently, anti-reflection films for light at a wavelength of 1.06 µm were formed on both sides. Then, the insertion loss (IL) was measured by entering $YVO_4$ laser light at a wavelength of 1.06 µm. An extremely favorable result of 0.38 dB was obtained.

Table 2 also shows these results collectively.

Example 3

An RIG was grown in the same manner as in Example 1, except that the raw material composition was changed by weighing 1.39 g of $Nd_2O_3$, 2.69 g of $Gd_2O_3$, 29.53 g of $Fe_2O_3$, 255.09 g of $Bi_2O_3$, 201.62 g of PbO, and 9.68 g of $B_2O_3$ as raw materials, and that the growth temperature was 783° C. In the obtained RIG, the amount of Bi was 1.10, and the amount of Gd was 1.08.

Then, the RIG was observed in the same manner as in Example 1. An extremely favorable result was obtained in which the number of defective pieces was 0 and the number of non-defective pieces was 100. In addition, the thickness of the RIG was adjusted by grinding to achieve a Faraday rotation angle of 45° for light at a wavelength of 1.06 µm. Subsequently, anti-reflection films for light at a wavelength of 1.06 µm were formed on both sides. Then, the insertion loss (IL) was measured by entering $YVO_4$ laser light at a wavelength of 1.06 µm. A favorable result of 0.41 dB was obtained.

Table 2 also shows these results collectively.

Example 4

An RIG was grown in the same manner as in Example 1, except that the raw material composition was changed by weighing 1.72 g of $Nd_2O_3$, 2.60 g of $Gd_2O_3$, 29.41 g of $Fe_2O_3$, 255.03 g of $Bi_2O_3$, 201.57 g of PbO, and 9.67 g of $B_2O_3$ as raw materials, and that the growth temperature was 793° C. In the obtained RIG, the amount of Bi was 0.96, and the amount of Gd was 1.06.

Then, the RIG was observed in the same manner as in Example 1. An extremely favorable result was obtained in which the number of defective pieces was 0 and the number of non-defective pieces was 100. In addition, the thickness of the RIG was adjusted by grinding to achieve a Faraday rotation angle of 45° for light at a wavelength of 1.06 μm. Subsequently, anti-reflection films for light at a wavelength of 1.06 μm were formed on both sides. Then, the insertion loss (IL) was measured by entering $YVO_4$ laser light at a wavelength of 1.06 μm. A favorable result of 0.52 dB was obtained.

Table 2 also shows these results collectively.

Example 5

An RIG was grown in the same manner as in Example 1, except that the raw material composition was changed by weighing 2.26 g of $Nd_2O_3$, 2.44 g of $Gd_2O_3$, 32.22 g of $Fe_2O_3$, 253.28 g of $Bi_2O_3$, 200.19 g of PbO, and 9.61 g of $B_2O_3$ as raw materials, and that the growth temperature was 815° C. In the obtained RIG, the amount of Bi was 0.85, and the amount of Gd was 1.03.

Then, the RIG was observed in the same manner as in Example 1. An extremely favorable result was obtained in which the number of defective pieces was 0 and the number of non-defective pieces was 100. In addition, the thickness of the RIG was adjusted by grinding to achieve a Faraday rotation angle of 45° for light at a wavelength of 1.06 μm. Subsequently, anti-reflection films for light at a wavelength of 1.06 μm were formed on both sides. Then, the insertion loss (IL) was measured by entering $YVO_4$ laser light at a wavelength of 1.06 μm. A favorable result of 0.56 dB was obtained.

Table 2 also shows these results collectively.

Example 6

An RIG was grown in the same manner as in Example 1, except that the raw material composition was changed by weighing 2.04 g of $Nd_2O_3$, 2.20 g of $Gd_2O_3$, 30.94 g of $Fe_2O_3$, 254.24 g of $Bi_2O_3$, 200.94 g of PbO, and 9.64 g of $B_2O_3$ as raw materials, and that the growth temperature was 810° C. In the obtained RIG, the amount of Bi was 0.87, and the amount of Gd was 0.89.

Then, the RIG was observed in the same manner as in Example 1. An extremely favorable result was obtained in which the number of defective pieces was 0 and the number of non-defective pieces was 100. In addition, the thickness of the RIG was adjusted by grinding to achieve a Faraday rotation angle of 45° for light at a wavelength of 1.06 μm. Subsequently, anti-reflection films for light at a wavelength of 1.06 μm were formed on both sides. Then, the insertion loss (IL) was measured by entering $YVO_4$ laser light at a wavelength of 1.06 μm. A favorable result of 0.53 dB was obtained.

Table 2 also shows these results collectively.

Example 7

An RIG was grown in the same manner as in Example 1, except that the raw material composition was changed by weighing 1.85 g of $Nd_2O_3$, 2.39 g of $Gd_2O_3$, 30.94 g of $Fe_2O_3$, 254.23 g of $Bi_2O_3$, 200.94 g of PbO, and 9.64 g of $B_2O_3$ as raw materials, and that the growth temperature was 790° C. In the obtained RIG, the amount of Bi was 0.87, and the amount of Gd was 1.43.

Then, the RIG was observed in the same manner as in Example 1. An extremely favorable result was obtained in which the number of defective pieces was 0 and the number of non-defective pieces was 100. In addition, the thickness of the RIG was adjusted by grinding to achieve a Faraday rotation angle of 45° for light at a wavelength of 1.06 μm. Subsequently, anti-reflection films for light at a wavelength of 1.06 μm were formed on both sides. Then, the insertion loss (IL) was measured by entering $YVO_4$ laser light at a wavelength of 1.06 μm. A favorable result of 0.51 dB was obtained.

Table 2 also shows these results collectively.

Example 8

An RIG was grown in the same manner as in Example 1, except that the raw material composition was changed by weighing 1.30 g of $Nd_2O_3$, 2.79 g of $Gd_2O_3$, 29.53 g of $Fe_2O_3$, 255.09 g of $Bi_2O_3$, 201.61 g of PbO, and 9.68 g of $B_2O_3$ as raw materials, and that the growth temperature was 772° C. In the obtained RIG, the amount of Bi was 1.17, and the amount of Gd was 0.90.

Then, the RIG was observed in the same manner as in Example 1. An extremely favorable result was obtained in which the number of defective pieces was 3 and the number of non-defective pieces was 97. In addition, the thickness of the RIG was adjusted by grinding to achieve a Faraday rotation angle of 45° for light at a wavelength of 1.06 μm. Subsequently, anti-reflection films for light at a wavelength of 1.06 μm were formed on both sides. Then, the insertion loss (IL) was measured by entering $YVO_4$ laser light at a wavelength of 1.06 μm. An extremely favorable result of 0.37 dB was obtained.

Table 2 also shows these results collectively.

Example 9

An RIG was grown in the same manner as in Example 1, except that the raw material composition was changed by weighing 1.40 g of $Nd_2O_3$, 2.94 g of $Gd_2O_3$, 29.41 g of $Fe_2O_3$, 255.02 g of $Bi_2O_3$, 201.56 g of PbO, and 9.67 g of $B_2O_3$ as raw materials, and that the growth temperature was 767° C. In the obtained RIG, the amount of Bi was 1.17, and the amount of Gd was 1.40.

Then, the RIG was observed in the same manner as in Example 1. A favorable result was obtained in which the number of defective pieces was 5 and the number of non-defective pieces was 95. In addition, the thickness of the RIG was adjusted by grinding to achieve a Faraday rotation angle of 45° for light at a wavelength of 1.06 μm. Subsequently, anti-reflection films for light at a wavelength of 1.06 μm were formed on both sides. Then, the insertion loss (IL) was measured by entering $YVO_4$ laser light at a wavelength of 1.06 μm. An extremely favorable result of 0.36 dB was obtained.

Table 2 also shows these results collectively.

Comparative Example 1

An RIG was grown in the same manner as in Example 1, except that the raw material composition was changed by weighing 1.11 g of $Nd_2O_3$, 2.87 g of $Gd_2O_3$, 29.59 g of $Fe_2O_3$, 255.12 g of $Bi_2O_3$, 201.64 g of PbO, and 9.68 g of $B_2O_3$ as raw materials, and that the growth temperature was 764° C. In the obtained RIG, the amount of Bi was 1.24, and the amount of Gd was 1.11.

Then, the RIG was observed in the same manner as in Example 1. A poor result was obtained in which the number of defective pieces was 26 and the number of non-defective pieces was 74. In addition, the thickness of the RIG was adjusted by grinding to achieve a Faraday rotation angle of 45° for light at a wavelength of 1.06 μm. Subsequently, anti-reflection films for light at a wavelength of 1.06 μm were formed on both sides. Then, the insertion loss (IL) was measured by entering YVO$_4$ laser light at a wavelength of 1.06 μm. A favorable result of 0.40 dB was obtained. Table 2 collectively shows these results.

Comparative Example 2

An RIG was grown in the same manner as in Example 1, except that the raw material composition was changed by weighing 1.05 g of Nd$_2$O$_3$, 2.83 g of Gd$_2$O$_3$, 29.64 g of Fe$_2$O$_3$, 255.15 g of Bi$_2$O$_3$, 201.66 g of PbO, and 9.68 g of B$_2$O$_3$ as raw materials, and that the growth temperature was 760° C. In the obtained RIG, the amount of Bi was 1.27, and the amount of Gd was 1.12.

Then, the RIG was observed in the same manner as in Example 1. A poor result was obtained in which the number of defective pieces was 58 and the number of non-defective pieces was 42. In addition, the thickness of the RIG was adjusted by grinding to achieve a Faraday rotation angle of 45° for light at a wavelength of 1.06 μm. Subsequently, anti-reflection films for light at a wavelength of 1.06 μm were formed on both sides. Then, the insertion loss (IL) was measured by entering YVO$_4$ laser light at a wavelength of 1.06 μm. A favorable result of 0.39 dB was obtained.

Table 2 collectively shows these results.

Comparative Example 3

An RIG was grown in the same manner as in Example 1, except that the raw material composition was changed by weighing 2.26 g of Nd$_2$O$_3$, 4.02 g of Gd$_2$O$_3$, 28.45 g of Fe$_2$O$_3$, 254.48 g of Bi$_2$O$_3$, 201.13 g of PbO, and 9.65 g of B$_2$O$_3$ as raw materials, and that the growth temperature was 760° C. As a result, the RIG peeled off because of the lattice mismatch. Moreover, cracks occurred on the entire surface. No RIG was obtained which enabled the measurement of the insertion loss (IL). Hence, a poor result was obtained in which the number of non-defective 1-mm square pieces was 0.

On the other hand, EPMA quantitative analysis of a fraction of the RIG showed that the amount of Bi was 1.00, and the amount of Gd was 1.45. Table 2 collectively shows these results.

Comparative Example 4

An RIG was grown in the same manner as in Example 1, except that the raw material composition was changed by weighing 2.26 g of Nd$_2$O$_3$, 2.44 g of Gd$_2$O$_3$, 32.22 g of Fe$_2$O$_3$, 253.28 g of Bi$_2$O$_3$, 200.19 g of PbO, and 9.61 g of B$_2$O$_3$ as raw materials, and that the growth temperature was 820° C. In the obtained RIG, the amount of Bi was 0.82, and the amount of Gd was 1.10.

Then, the RIG was observed in the same manner as in Example 1. An extremely favorable result was obtained in which the number of defective pieces was 0 and the number of non-defective pieces was 100. In addition, the thickness of the RIG was adjusted by grinding to achieve a Faraday rotation angle of 45° for light at a wavelength of 1.06 μm. Subsequently, anti-reflection films for light at a wavelength of 1.06 μm were formed on both sides. Then, the insertion loss (IL) was measured by entering YVO$_4$ laser light at a wavelength of 1.06 μm. An unfavorable result was obtained in which the insertion loss (IL) was 0.61 dB, which exceeded 0.60 dB.

Table 2 collectively shows these results.

Comparative Example 5

An RIG was grown in the same manner as in Example 1, except that the raw material composition was changed by weighing 2.31 g of Nd$_2$O$_3$, 2.98 g of Gd$_2$O$_3$, 28.93 g of Fe$_2$O$_3$, 254.76 g of Bi$_2$O$_3$, 201.36 g of PbO, and 9.66 g of B$_2$O$_3$ as raw materials, and that the growth temperature was 790° C. In the obtained RIG, the amount of Bi was 1.00, and the amount of Gd was 0.82.

Then, the RIG was observed in the same manner as in Example 1. An unfavorable result was obtained in which the number of defective pieces was 21 and the number of non-defective pieces was 79. In addition, the thickness of the RIG was adjusted by grinding to achieve a Faraday rotation angle of 45° for light at a wavelength of 1.06 μm. Subsequently, anti-reflection films for light at a wavelength of 1.06 μm were formed on both sides. Then, the insertion loss (IL) was measured by entering YVO$_4$ laser light at a wavelength of 1.06 μm. A favorable result of 0.55 dB was obtained.

Table 2 collectively shows these results.

Comparative Example 6

An RIG was grown in the same manner as in Example 1, except that the raw material composition was changed by weighing 1.94 g of Nd$_2$O$_3$, 2.30 g of Gd$_2$O$_3$, 30.94 g of Fe$_2$O$_3$, 254.24 g of Bi$_2$O$_3$, 200.94 g of PbO, and 9.64 g of B$_2$O$_3$ as raw materials, and that the growth temperature was 810° C. In the obtained RIG, the amount of Bi was 0.78, and the amount of Gd was 0.89.

Then, the RIG was observed in the same manner as in Example 1. An extremely favorable result was obtained in which the number of defective pieces was 0 and the number of non-defective pieces was 100. In addition, the thickness of the RIG was adjusted by grinding to achieve a Faraday rotation angle of 45° for light at a wavelength of 1.06 μm. Subsequently, anti-reflection films for light at a wavelength of 1.06 μm were formed on both sides. Then, the insertion loss (IL) was measured by entering YVO$_4$ laser light at a wavelength of 1.06 μm. An unfavorable result was obtained in which the insertion loss (IL) was 0.62 dB, which exceeded 0.60 dB.

Table 2 collectively shows these results.

TABLE 2

| | Amount of Bi | Amount of Gd | Number of defective 1-mm square pieces | Number of non-defective 1-mm square pieces | Defective rate (%) | Yield of non-defective pieces (%) | Insertion loss (dB) |
|---|---|---|---|---|---|---|---|
| Example: | | | | | | | |
| 1 | 1.19 | 1.10 | 10 | 90 | 10 | 90 | 0.36 |
| 2 | 1.17 | 1.10 | 2 | 98 | 2 | 98 | 0.38 |
| 3 | 1.10 | 1.08 | 0 | 100 | 0 | 100 | 0.41 |

TABLE 2-continued

|   | Amount of Bi | Amount of Gd | Number of defective 1-mm square pieces | Number of non-defective 1-mm square pieces | Defective rate (%) | Yield of non-defective pieces (%) | Insertion loss (dB) |
|---|---|---|---|---|---|---|---|
| 4 | 0.96 | 1.06 | 0 | 100 | 0 | 100 | 0.52 |
| 5 | 0.85 | 1.03 | 0 | 100 | 0 | 100 | 0.56 |
| Comparative Example: | | | | | | | |
| 1 | 1.24 | 1.11 | 26 | 74 | 26 | 74 | 0.40 |
| 2 | 1.27 | 1.12 | 58 | 42 | 58 | 42 | 0.39 |
| Example: | | | | | | | |
| 6 | 0.87 | 0.89 | 0 | 100 | 0 | 100 | 0.53 |
| 7 | 0.87 | 1.43 | 0 | 100 | 0 | 100 | 0.51 |
| 8 | 1.17 | 0.90 | 3 | 97 | 3 | 97 | 0.37 |
| 9 | 1.17 | 1.40 | 5 | 95 | 5 | 95 | 0.36 |
| Comparative Example: | | | | | | | |
| 3 | 1.00 | 1.45 | 100 | 0 | 100 | 0 | — |
| 4 | 0.82 | 1.10 | 0 | 100 | 0 | 100 | 0.61 |
| 5 | 1.00 | 0.82 | 21 | 79 | 21 | 79 | 0.55 |
| 6 | 0.78 | 0.89 | 0 | 100 | 0 | 100 | 0.62 |

POSSIBILITY OF INDUSTRIAL APPLICATION

The bismuth-substituted rare-earth iron garnet crystal film (RIG) according to the present invention has an insertion loss which is less than 0.6 dB and which is equivalent to those of the RIGs described in Patent Documents 5 and 6, and can be produced in a high yield. In addition, the RIG according to the present invention makes it possible to reduce the amount of heat generated because of absorption of light at wavelengths of about 1 μm. Hence, the RIG according to the present invention is industrially applicable as a Faraday rotator used for an optical isolator in a high-power laser device for processing.

The invention claimed is:
1. A bismuth-substituted rare-earth iron garnet crystal film which is grown by liquid phase epitaxy on a non-magnetic garnet substrate represented by a chemical formula of $Gd_3(ScGa)_5O_{12}$, wherein
the bismuth-substituted rare-earth iron garnet crystal film is represented by a chemical formula of $Nd_{3-x-y}Gd_xBi_yFe_5O_{12}$, and
x and y in the chemical formula satisfy $0.89 \leq x \leq 1.43$ and $0.85 \leq y \leq 1.10$.
2. An optical isolator comprising the bismuth-substituted rare-earth iron garnet crystal film according to claim 1 used as a Faraday rotator.

* * * * *